(12) United States Patent
Ono

(10) Patent No.: US 11,418,870 B2
(45) Date of Patent: Aug. 16, 2022

(54) VOLUME ADJUSTMENT DEVICE AND VOLUME ADJUSTMENT METHOD

(71) Applicant: Yamaha Corporation, Hamamatsu (JP)

(72) Inventor: Yusuke Ono, Hamamatsu (JP)

(73) Assignee: Yamaha Corporation, Hamamatsu (JP)

(*) Notice: Subject to any disclaimer, the term of this patent is extended or adjusted under 35 U.S.C. 154(b) by 0 days.

(21) Appl. No.: 17/169,642

(22) Filed: Feb. 8, 2021

(65) Prior Publication Data

US 2021/0250681 A1    Aug. 12, 2021

(30) Foreign Application Priority Data

Feb. 10, 2020    (JP) .............................. JP2020-020807

(51) Int. Cl.
*H04R 1/32* (2006.01)
*H03G 7/06* (2006.01)
*H04R 1/02* (2006.01)
*H04R 29/00* (2006.01)

(52) U.S. Cl.
CPC .............. *H04R 1/323* (2013.01); *H03G 7/06* (2013.01); *H04R 1/025* (2013.01); *H04R 29/001* (2013.01)

(58) Field of Classification Search
CPC ...... H04R 1/323; H04R 1/025; H04R 29/001; H03G 7/06
See application file for complete search history.

(56) References Cited

U.S. PATENT DOCUMENTS

| 2010/0296658 A1* | 11/2010 | Ohashi | H04S 7/305 |
| | | | 381/57 |
| 2014/0072126 A1 | 3/2014 | Uhle et al. | |
| 2015/0208191 A1* | 7/2015 | Sako | H04R 3/12 |
| | | | 381/303 |

FOREIGN PATENT DOCUMENTS

| EP | 2 552 131 A2 | 1/2013 |
| JP | 2006-261808 A | 9/2006 |
| JP | 2016-116036 A | 6/2016 |

OTHER PUBLICATIONS

European Search Report issued in European Application No. 21155715.2 dated Jun. 16, 2021 (nine (9) pages).

* cited by examiner

*Primary Examiner* — Andrew L Sniezek
(74) *Attorney, Agent, or Firm* — Crowell & Moring LLP

(57) ABSTRACT

A volume adjustment device includes a microphone, a speaker, and a signal processing unit. The at least one signal processing unit includes at least one processor and at least one memory. The signal processing unit is configured to output a measurement sound from the speaker. The signal processing unit is also configured to measure a first impulse response with the microphone. The signal processing unit is also configured to adjust a volume of the measurement sound output from the speaker based on a direct sound component of the first impulse response and an indirect sound component of the first impulse response.

18 Claims, 5 Drawing Sheets

VOLUME ADJUSTMENT DEVICE AND VOLUME ADJUSTMENT METHOD

CROSS REFERENCE TO RELATED APPLICATIONS

This application claims priority to Japanese Patent Application No. 2020-020807 filed on Feb. 10, 2020, the entire contents of which are incorporated herein by reference.

BACKGROUND

Technical Field

This specification relates to a volume adjustment device and a volume adjustment method, which adjust a volume.

Description of Related Art

An acoustic control device may output a test sound from a speaker, acquires the test sound with a microphone, and controls frequency characteristics.

The sound that reaches a listening position after being output from the speaker includes not only a direct sound but also an indirect sound such as a reflected sound and a reverberant sound in a room. In order to hear the sound output from the speaker at an appropriate volume at the listening position, the volume needs to be adjusted in consideration of not only the direct sound but also the indirect sound. In order to perform such an appropriate volume adjustment, the microphone needs to be installed at an appropriate position to measure a sound pressure.

According to a related art, it is difficult to determine what position the microphone should be installed in and what kind of measurement should be performed.

SUMMARY

This specification provides a volume adjustment device and a volume adjustment method capable of adjusting a volume to an appropriate level regardless of an installation position of a microphone.

An inventive volume adjustment device includes a microphone, a speaker, and a signal processing unit configured to output a measurement sound from the speaker, to measure a first impulse response with the microphone, and to adjust a volume of a sound signal output from the speaker based on levels of a direct sound component and an indirect sound component of the first impulse response.

In the inventive volume adjustment device the volume can be adjusted to an appropriate level regardless of an installation position of the microphone. Other objects, advantages and novel features of the embodiments of the present invention will become apparent from the following detailed description of one or more preferred embodiments when considered in conjunction with the accompanying drawings, in which:

DETAILED DESCRIPTION

Figure 1:
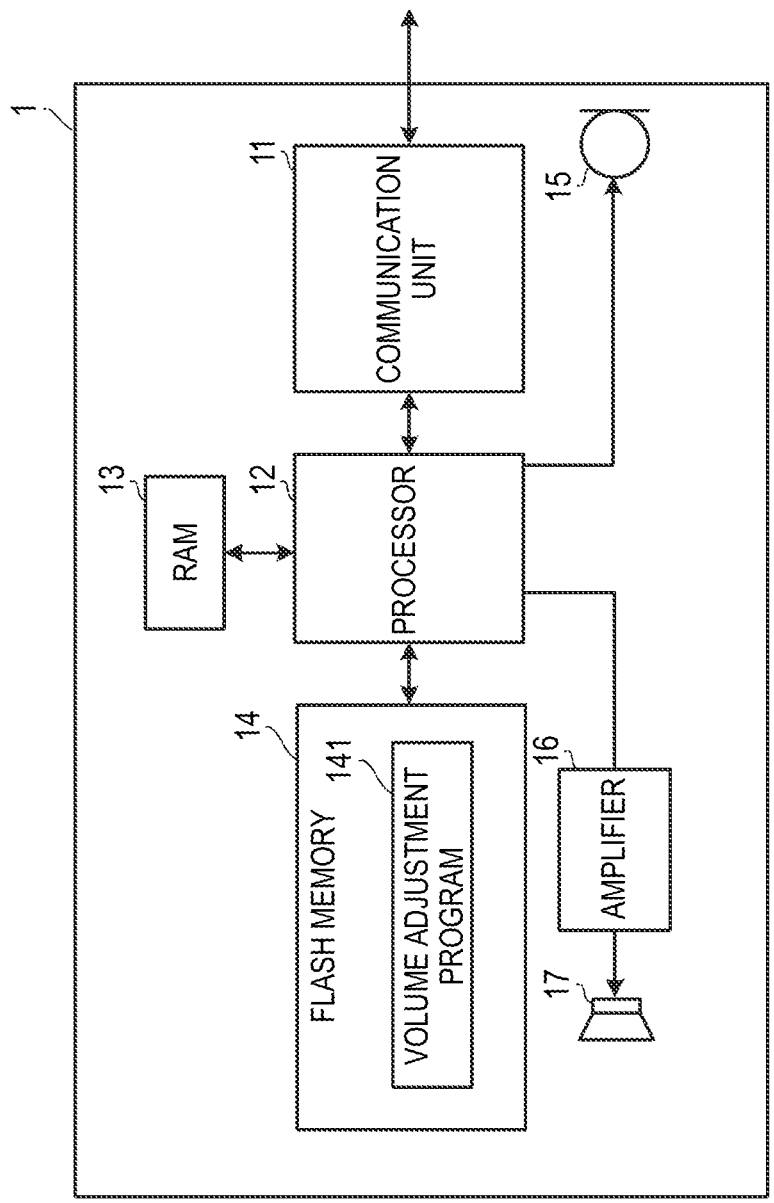
FIG. 1 is a block diagram showing a configuration of a volume adjustment device.

FIG. 1 is a block diagram showing a configuration of a volume adjustment device 1. The volume adjustment device 1 includes a communication unit 11, a processor 12, a RAM 13, a flash memory 14, a microphone 15, an amplifier 16 and a speaker 17. The volume adjustment device 1 may include a plurality of speakers 17.

Figure 2:
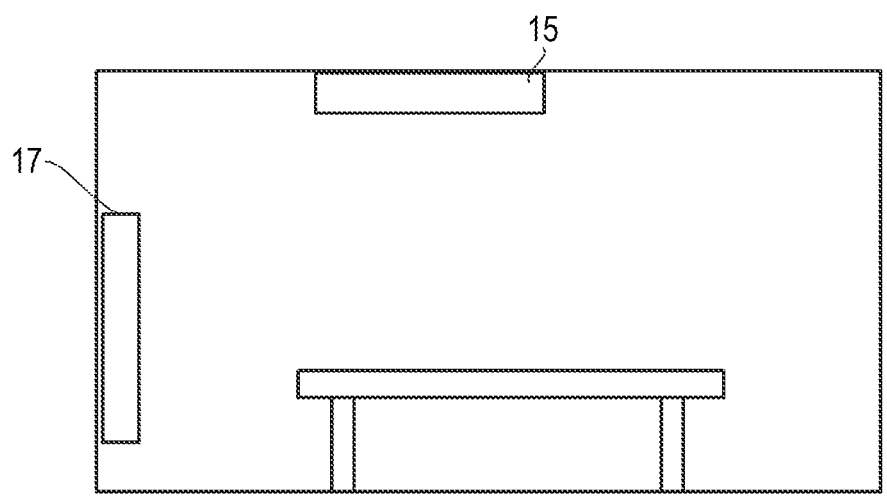
FIG. 2 is an indoor schematic view showing a positional relationship between a microphone and a speaker.

FIG. 2 is an indoor schematic view showing a positional relationship between the microphone 15 and the speaker 17. In this example, the microphone 15 is installed on a ceiling of a room. The speaker 17 is installed on a wall surface of the room. However, in the present disclosure, an installation mode of the microphone and the speaker is not limited to the example shown in FIG. 2. For example, the speaker and the microphone may be installed on a desk.

The volume adjustment device 1 constitutes, for example, a remote conference device. The volume adjustment device 1 transmits a sound signal acquired by the microphone 15 to a far end side. The volume adjustment device 1 outputs a sound from the speaker 17 based on the sound signal received from the far end side. The volume adjustment device 1 adjusts a volume of the sound signal received from the far end side. The volume adjustment device of the present disclosure is not limited to the example applied to the remote conference device. The volume adjustment device of the present disclosure does not need to include the communication unit 11. The volume adjustment device 1 may, for example, reproduce a content stored in the flash memory 14 and adjust a volume of the reproduced sound signal. That is, the volume adjustment device of the present disclosure can be applied to any device as long as the device includes at least a speaker, a microphone and a signal processing function.

In FIG. 1, the communication unit 11 is connected to a remote conference device on the far end side via the Internet or the like, and transmits and receives a sound signal to and from the remote conference device on the far end side.

The processor 12 is an example of a signal processing unit of the present disclosure, and includes a CPU, a DSP, a system on a chip (SoC) or the like. The processor 12 reads a program from the flash memory 14 serving as a storage medium, and temporarily stores the program in the RAM 13, thereby performing various operations. The program includes a volume adjustment program 141. The flash memory 14 also stores a program for the operation of the processor 12, such as firmware.

The microphone 15 acquires a sound in the room as a sound signal. The sound in the room includes, for example, a voice of a speaking person on a near end side, a sound output from the speaker, and an indirect sound (a reflected sound and a reverberant sound in the room). The microphone 15 digitally converts the acquired sound signal. The microphone 15 outputs the digitally converted sound signal to the processor 12.

The processor 12 performs predetermined signal processing on the sound signal acquired by the microphone 15 and the sound signal output from the speaker 17. For example, the processor 12 adjusts a volume of the sound signal acquired by the microphone 15. The processor 12 transmits the sound signal whose volume has been adjusted to the far end side via the communication unit 11. The processor 12 adjusts a volume of a sound signal received via the communication unit 11. The processor 12 outputs the sound signal whose volume has been adjusted to the amplifier 16.

The amplifier 16 performs analog conversion on the sound signal received from the processor 12 and amplifies the sound signal. The amplifier 16 outputs the amplified sound signal to the speaker 17. The speaker 17 outputs a sound based on the sound signal output from the amplifier 16.

The processor 12 implements a volume adjustment method of the present disclosure. In particular, the processor 12 adjusts the volume of the sound signal received via the communication unit 11 as the volume adjustment method of the present disclosure. Specifically, the processor 12 outputs a measurement sound from the speaker 17 and measures an impulse response with the microphone 15. Then, the processor 12 adjusts the volume of the sound signal output from the speaker 17 based on a direct sound component and an indirect sound component of the impulse response. The volume adjustment method of the present disclosure will be described in detail below with reference to a flowchart in FIG. 3.

Figure 3:
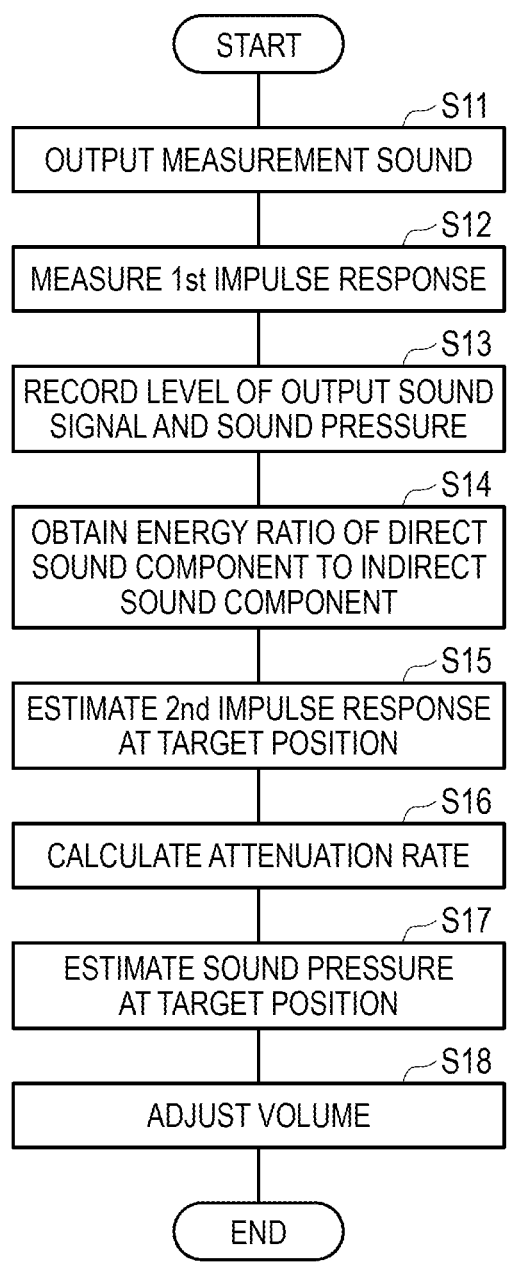
FIG. 3 is a flowchart showing an operation of a processor.

FIG. 3 is the flowchart showing a specific operation of the volume adjustment program 141 executed by the processor 12.

First, the processor 12 outputs the measurement sound from the speaker 17 (S11). The measurement sound may be any sound, for example, white noise or pink noise.

Thereafter, the processor 12 acquires a sound signal related to the measurement sound with the microphone 15, and measures the impulse response (hereinafter, referred to as a first impulse response) (S12). At this time, the processor 12 records, in the RAM 13 or the flash memory 14, a level of the sound signal of the measurement sound output to the amplifier 16 and a first sound pressure (dB SPL) of the sound signal acquired by the microphone 15 (S13). Information indicating a sound pressure (that is, sensitivity of the microphone 15) with respect to a level of the sound signal acquired by the microphone 15 is stored in advance in the flash memory 14. The processor 12 reads the information on the sensitivity and measures the first sound pressure from the level of the sound signal acquired by the microphone 15.

Then, the processor 12 obtains an energy ratio of the direct sound component to the indirect sound component of the first impulse response (S14).

Figure 4:
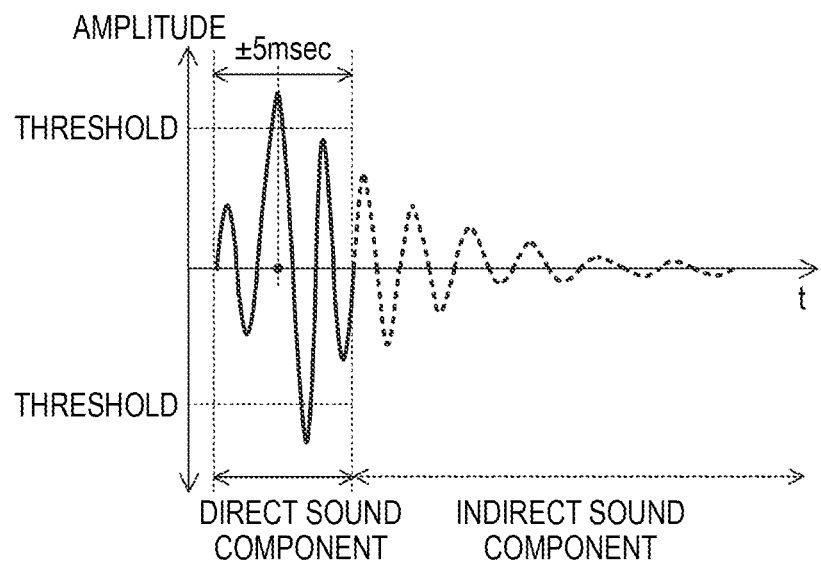
FIG. 4 is a schematic diagram showing a direct sound component of a first impulse response.
Figure 5:
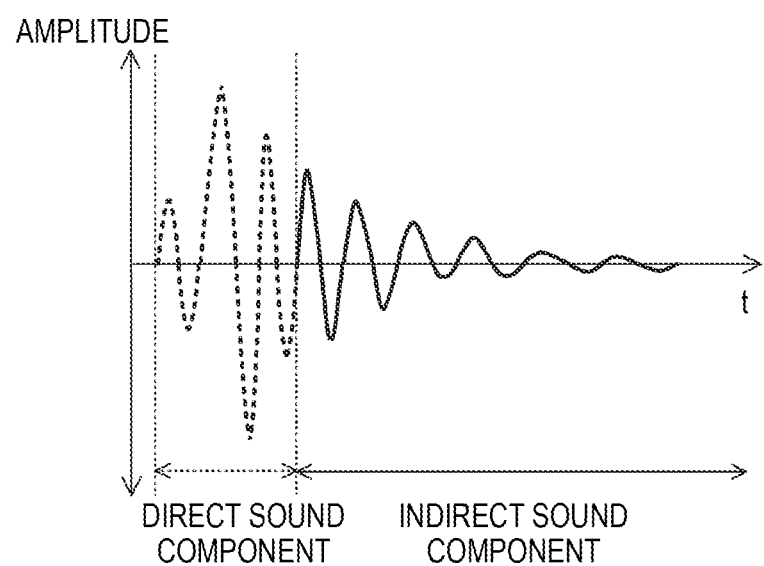
FIG. 5 is a schematic diagram showing an indirect sound component of the first impulse response.

FIG. 4 is a schematic diagram showing the direct sound component of the first impulse response, and FIG. 5 is a schematic diagram showing the indirect sound component of the first impulse response. In graphs shown in FIGS. 4 and 5, a horizontal axis represents time, and a vertical axis represents amplitude.

For example, as shown in FIG. 4, when a level at which an absolute value of the amplitude exceeds a predetermined threshold (a peak of the direct sound from the speaker 17 to the microphone 15) is detected, the processor 12 defines the first impulse response ±5 msec from the peak of the direct sound as the direct sound component. As shown in FIG. 5, the processor 12 defines a portion obtained by removing the direct sound component from the first impulse response as the indirect sound component. Of course, a method of defining the direct sound component and the indirect sound component is not limited to this example. The processor 12 may define, for example, a component of 0 to 50 msec as the direct sound component and a component after 50 msec as the indirect sound component. Alternatively, the processor 12 may define a component of the first impulse response up to a reference time point as the direct sound component and a component after the reference time point as the indirect sound component, based on the time point at which a predetermined level (for example, ½) is reached with respect to a level of the peak of the direct sound in the first impulse response.

The processor 12 obtains the energy ratio of the direct sound component to the indirect sound component. For example, the processor 12 obtains square integrated values (that is, power) of respective amplitudes of the direct sound component and the indirect sound component, and obtains a power ratio as the energy ratio. However, the energy ratio is not limited to the power ratio. For example, the processor 12 may obtain averages of absolute values of the respective amplitudes of the direct sound component and the indirect sound component, and use a ratio of the averages as the energy ratio.

Figure 6:
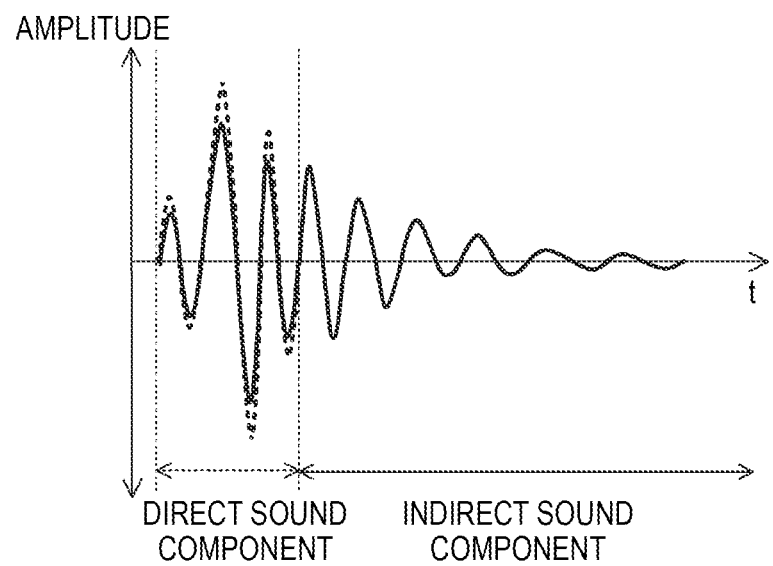
FIG. 6 shows a relationship between a distance and a sound pressure.

Thereafter, the processor 12 estimates the impulse response at a target position (hereinafter referred to as the second impulse response) (S15). FIG. 6 is a schematic diagram of the second impulse response. The impulse response shown by a dotted line in FIG. 6 is the first impulse response and a solid line is the second impulse response. The processor 12 estimates the second impulse response at the target position by, for example, attenuating or amplifying the direct sound component such that the power ratio is a predetermined value. For example, the processor 12 attenuates or amplifies the direct sound component by multiplying all samples of the direct sound component by a predetermined multiplication coefficient. The predetermined multiplication coefficient is obtained from power of the direct sound component and power of a target (the above power ratio). Alternatively, the processor 12 may estimate the second impulse response by thinning out some samples of the direct sound component. The processor 12 may estimate the second impulse response by approximating an attenuation shape of the amplitude according to a passage of time to any attenuation shape (for example, a shape in which the amplitude is attenuated in a polygonal line shape).

The predetermined value is, for example, −6 dB. That is, the target position is, for example, a position where the power of the direct sound component is −6 dB with respect to the power of the indirect sound component. When the power of the direct sound component is larger than −6 dB with respect to the power of the indirect sound component, the processor 12 estimates the second impulse response by attenuating the direct sound component of the first impulse response. When the power of the direct sound component is smaller than −6 dB with respect to the power of the indirect sound component, the processor 12 estimates the second impulse response by amplifying the direct sound component of the first impulse response. Of course, the predetermined value in the present disclosure is not limited to −6 dB. The predetermined value may be, for example, −3 dB.

A method of estimating the second impulse response is not limited to this example. For example, the second impulse response may be estimated by attenuating a peak component of the first impulse response that exceeds a threshold. The flash memory 14 may store in advance, in the flash memory 14, an ideal impulse response (an impulse response in which the indirect sound component is −6 dB with respect to the direct sound component), or a power curve of the ideal impulse response. In this case, the processor 12 estimates the second impulse response by adjusting an overall level of the ideal impulse response according to the power of the indirect sound component of the first impulse response. For example, when the power of the indirect sound component of the first impulse response is 6 dB higher than the power of the indirect sound component of the ideal impulse response, the processor 12 attenuates the ideal impulse response by 6 dB (or a value obtained by multiplying 6 dB by a predetermined coefficient) to estimate the second impulse response. The processor 12 may receive an input of a shape, a volume, a sound absorption rate or the like of the room from a user of the volume adjustment device 1, and estimate the second impulse response from these pieces of information. Also in this case, the processor 12 adjusts the overall level of the estimated second impulse response according to the power of the indirect sound component of the first impulse response. When a camera is provided, the volume adjustment device 1 may capture an image of inside of the room and estimate the shape, the volume, the sound absorption rate or the like of the room. In this case, the processor 12 estimates the second impulse response based on information on the estimated shape, volume, sound absorption rate or the like of the room.

In the present embodiment, since the second impulse response is used for estimating a sound pressure at the target position, the second impulse response is sufficient to estimate an outline. The method of estimating the second impulse response may be any method as long as the sound pressure at the target position can be estimated regardless of individual amplitude values in the second impulse response.

Figure 7:
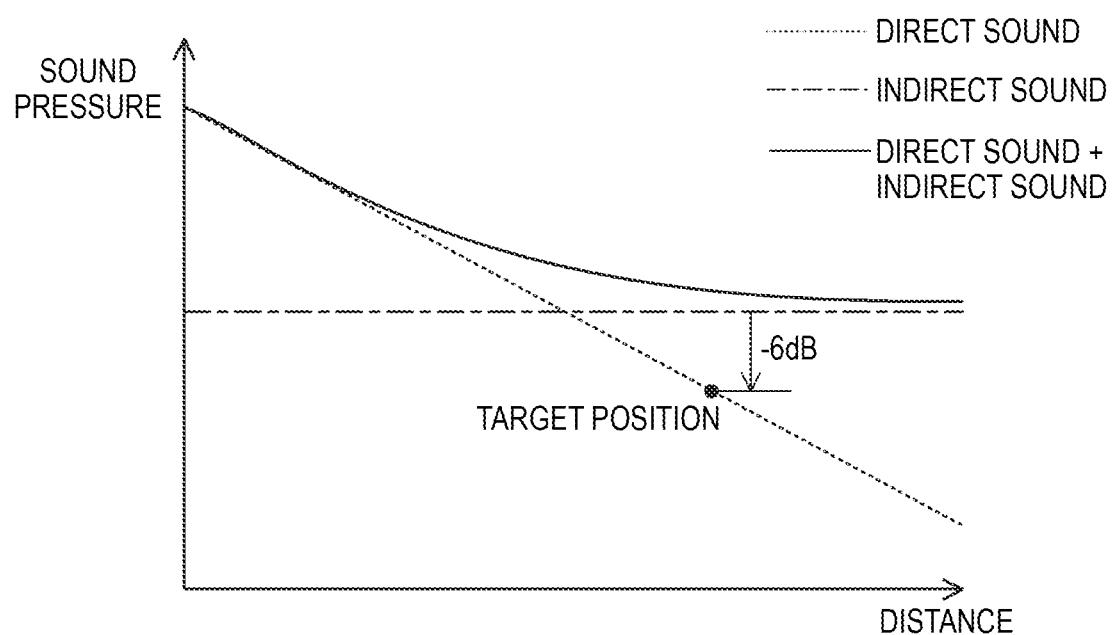
FIG. 7 is a schematic diagram showing a second impulse response.

FIG. 7 is a diagram showing a relationship between a distance and a sound pressure. A horizontal axis in FIG. 7 represents the distance (logarithm) from the speaker, and the vertical axis represents the sound pressure (dB SPL). As shown in FIG. 7, the sound pressure of the direct sound is attenuated in proportion to the distance. On the other hand, the sound pressure of the indirect sound largely depends on acoustic characteristics of the room, and thus is substantially constant regardless of the distance. The sound pressure of the sound actually output from the speaker 17 is attenuated while being affected by the acoustic characteristics of the room. Therefore, as shown by "DIRECT SOUND+INDIRECT SOUND" in FIG. 7, as the distance from the speaker 17 is reduced, the "DIRECT SOUND+INDIRECT SOUND" depends more on attenuation of the direct sound; and as the distance from the speaker 17 is increased, the "DIRECT SOUND+INDIRECT SOUND" comes to constant depending on the indirect sound. That is, as the distance from the speaker 17 is increased, the direct sound component of the impulse response is attenuated, and the indirect sound component thereof is not changed substantially. Therefore, the processor 12 can estimate the second impulse response at the target position (for example, a position where the power of the direct sound component is −6 dB with respect to the power of the indirect sound component) by attenuating or amplifying the direct sound component of the first impulse response.

Next, the processor 12 calculates an attenuation rate based on the first impulse response and the second impulse response (S16). The attenuation rate is a value indicating a rate by which the sound pressure of the sound output from the speaker 17 is decreased according to the distance from the speaker 17. The processor 12 sets a logarithmic value of the value obtained by dividing the power of the second impulse response by the power of the first impulse response as the attenuation rate. As shown in FIG. 7, the sound output from the speaker 17 is gradually attenuated. The processor 12 estimates a second sound pressure at the target position based on the calculated attenuation rate (S17). That is, the processor 12 estimates the second sound pressure at the target position by adding the attenuation rate to the first sound pressure of the sound signal recorded in the RAM 13 or the flash memory 14 and acquired by the microphone 15. Finally, the processor 12 adjusts the level of the sound signal output to the amplifier 16 such that the estimated second sound pressure has a desired value (for example, 60 dB SPL). The processor 12 adjusts the level of the sound signal such that the second sound pressure has the desired value, based on a relationship between the level of the sound signal of the measurement sound output to the amplifier 16 and the first sound pressure of the sound signal acquired by the microphone 15, recorded in the RAM 13 or the flash memory 14. Accordingly, the processor 12 adjusts the volume of the sound output from the speaker 17 (S18).

With the above operation, the processor 12 adjusts the volume in consideration of not only the direct sound component but also the indirect sound component that depends on the acoustic characteristics of the room. The processor 12 can adjust the volume to an appropriate level regardless of an installation position of the microphone.

One or more embodiments provide a volume adjustment device.

In an aspect (1), a volume adjustment device includes: a microphone; a speaker; and a signal processing unit including at least one processor and at least one memory. The signal processing unit is configured to output a measurement sound from the speaker, to measure a first impulse response with the microphone, and to adjust a volume of the measurement sound output from the speaker based on a direct sound component and an indirect sound component of the first impulse response.

For example, when an installation position of the microphone is closer to the speaker than a target position, the direct sound component is larger than the indirect sound component. According, to the aspect (1), the volume adjustment device can estimate a relationship between the installation position of the microphone and the target position (for example, a position where the direct sound component is −6 dB with respect to the indirect sound component) by comparing power of the direct sound component and power of the indirect sound component, for example. That is, the volume adjustment device can adjust the volume based on the relationship between the estimated installation position of the microphone and the target position. For example, the volume adjustment device reduces the volume when the direct sound component is large. Accordingly, the volume adjustment device can adjust the volume to an appropriate level regardless of the installation position of the microphone. Alternatively, the volume adjustment device may adjust the volume based on a difference between an absolute value of an amplitude of a first peak of the first impulse response whose amplitude exceeds a threshold and an average value of absolute values of amplitudes of the indirect sound component. Also in this case, the volume adjustment device can adjust the volume to an appropriate level regardless of the installation position of the microphone.

In an aspect (2), the signal processing unit may estimate a second impulse response at a target position based on the first impulse response, and adjust the volume based on the second impulse response.

According to the aspect (2), when the volume adjustment device adjusts the volume according to a ratio of power of the measured first impulse response to power of the estimated second impulse response, the volume adjustment device can adjust the volume to a more appropriate level in consideration of the second impulse response at the target position. When the second impulse response is estimated by adjusting an overall level of an ideal impulse response according to the power of the indirect sound component of the first impulse response, the volume may be adjusted based on an adjustment amount of the level. The processor 12 may attenuate the volume by 6 dB when the level of the ideal impulse response is attenuated by 6 dB. The processor 12 may adjust the volume based on, for example, the power of the estimated second impulse response and a predetermined power stored in the flash memory 14. The processor 12 may amplify the volume by 6 dB when the predetermined power stored in the flash memory 14 is 6 dB larger than the power of the estimated second impulse response.

In an aspect (3), the signal processing unit may estimate the second impulse response by adjusting the direct sound component such that an energy ratio of an direct sound component energy of the direct sound component of the first impulse response to an indirect sound component energy of the indirect sound component of the first impulse response is a predetermined energy ratio.

In an aspect (4), the signal processing unit may estimate a sound pressure at the target position of the measurement sound based on a first impulse response energy of the first impulse response and a second impulse response energy of the second impulse response, and adjust the volume such that the sound pressure is at a predetermined level.

In an aspect (5), the signal processing unit may estimate the sound pressure at the target position based on a power ratio of a first impulse response power of the first impulse response to a second impulse response power of the second impulse response.

According to the aspects (5) to (7), the measurement sound output from the speaker is gradually attenuated under influence of the indirect sound component. The volume adjustment device estimates the second sound pressure at the target position based on energy (for example, the power ratio) of the first impulse response and the second impulse response. As a result, the volume adjustment device can further adjust the volume to an appropriate level.

In an aspect (6), the target position may correspond to a position where the power ratio is a predetermined value.

According to the aspect (6), the volume adjustment device can adjust the volume such that a ratio of a volume of the direct sound component to a volume of the indirect sound component is an appropriate ratio.

As described above, the energy ratio is, for example, the power ratio, and may be, for example, a ratio of averages of absolute values of respective amplitudes of the direct sound component and the indirect sound component.

In an aspect (7), the signal processing unit may estimate an attenuation rate of the measurement sound output from the speaker based on the power ratio, and estimate a second sound pressure at the target position based on a first sound pressure measured by the microphone of the measurement sound and the attenuation rate.

In an aspect (8), the signal processing unit may adjust the volume such that the second sound pressure is at a predetermined level.

According to the aspects (7) and (8), the volume adjustment device can adjust the sound pressure (an absolute volume) including the direct sound component and the indirect sound component to a target sound pressure at the target position.

In an aspect (9), the speaker may include a plurality of speakers, and the signal processing unit may output the measurement sound from each of the plurality of speakers, measure a plurality of first impulse responses, average the plurality of first impulse responses, and adjust a volume of a measurement sound output from each of the plurality of speakers based on a direct sound component of the averaged first impulse response and an indirect sound component of the averaged first impulse response.

The signal processing unit may adjust the volume based on the direct sound component and the indirect sound component of each first impulse response.

In an aspect (10), the direct sound component may correspond to the first impulse response within a predetermined time range before and after a first peak of the first impulse response, after the measurement sound is output.

In an aspect (11), the volume adjustment device may adjust the volume to an appropriate level regardless of the installation position of the microphone. The microphone may be installed on a ceiling of a room.

In an aspect (12), the volume adjustment device may include a communication unit configured to receive a sound signal from a far end side. In this case, the signal processing unit is configured to adjust the volume of the measurement sound output from the speaker by adjusting a level of the sound signal received on the communication unit.

The volume adjustment device does not need to measure the first impulse response with the microphone 15 for transmitting the sound signal to the far end side. The volume adjustment device may include a dedicated microphone for measuring the first impulse response.

The foregoing disclosure has been set forth merely to illustrate the embodiments of the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A volume adjustment device comprising:
a microphone;
a speaker; and
a signal processing unit, wherein
the signal processing unit is configured to: i) output a measurement sound from the speaker, ii) measure a first impulse response with the microphone, and iii) adjust a volume of the measurement sound output from the speaker based on a direct sound component of the first impulse response and an indirect sound component of the first impulse response, and
the signal processing unit is also configured to estimate a second impulse response at a target position based on the first impulse response, and adjust the volume based on the second impulse response.

2. The volume adjustment device according to claim 1, wherein the signal processing unit is also configured to estimate the second impulse response by adjusting the direct sound component such that an energy ratio of a direct sound component energy of the direct sound component of the first impulse response to an indirect sound component energy of the indirect sound component of the first impulse response is a predetermined energy ratio.

3. The volume adjustment device according to claim 1, wherein the signal processing unit is also configured to: i) estimate a sound pressure at the target position of the measurement sound based on a first impulse response energy of the first impulse response and a second impulse response energy of the second impulse response, and ii) adjust the volume such that the sound pressure is at a predetermined level.

4. The volume adjustment device according to claim 3, wherein the signal processing unit configured to estimate the sound pressure at the target position based on a power ratio of a first impulse response power of the first impulse response to a second impulse response power of the second impulse response.

5. The volume adjustment device according to claim 4, wherein the target position corresponds to a position where the power ratio is a predetermined value.

6. The volume adjustment device according to claim 4, wherein the signal processing unit is also configured to: i) estimate an attenuation rate of the measurement sound output from the speaker based on the power ratio, and ii) estimate a second sound pressure at the target position based on a first sound pressure measured by the microphone of the measurement sound and the attenuation rate.

7. The volume adjustment device according to claim 6, wherein the signal processing unit is also configured to adjust the volume such that the second sound pressure is at a predetermined level.

8. The volume adjustment device according to claim 1, wherein the speaker includes a plurality of speakers, and wherein the signal processing unit is also configured to: i) output the measurement sound from each of the plurality of speakers, ii) measure a plurality of first impulse responses, iii) average the plurality of first impulse responses, and iv) adjust a volume of a measurement sound output from each of the plurality of speakers based on a direct sound component of the averaged first impulse response and an indirect sound component of the averaged first impulse response.

9. The volume adjustment device according to claim 1, wherein the direct sound component corresponds to the first impulse response within a predetermined time range before and after a first peak of the first impulse response, after the measurement sound is output.

10. The volume adjustment device according to claim 1, wherein the microphone is installed on a ceiling of a room.

11. The volume adjustment device according to claim 1, further comprising:
a communication unit configured to receive a sound signal from a far end side,
wherein the signal processing unit is also configured to adjust the volume of the measurement sound output from the speaker by adjusting a level of the sound signal received on the communication unit.

12. A volume adjustment method comprising:
outputting a measurement sound from a speaker;
measuring a first impulse response with a microphone;
adjusting a volume of a measurement sound output from the speaker based on a direct sound component of the first impulse response and an indirect sound component of the first impulse response; and
estimating a second impulse response at a target position based on the first impulse response; and
adjusting the volume based on the second impulse response.

13. The volume adjustment method according to claim 12, further comprising:
estimating the second impulse response by adjusting the direct sound component such that an energy ratio of an direct sound component energy of the direct sound component to an indirect sound component energy of the indirect sound component of the first impulse response is a predetermined energy ratio.

14. The volume adjustment method according to claim 12, further comprising:
estimating a sound pressure at the target position of the measurement sound based on a first impulse response energy of the first impulse response and a second impulse response energy of the second impulse response; and
adjusting the volume such that the sound pressure is at a predetermined level.

15. The volume adjustment method according to claim 14, farther comprising:
estimating the sound pressure at the target position based on a power ratio of a first impulse response power of the first impulse response to a second impulse response power of the second impulse response.

16. The volume adjustment method according to claim 15, wherein the target position corresponds to a position where the power ratio is a predetermined value.

17. The volume adjustment method according to claim 15, further comprising:
estimating an attenuation rate of the measurement sound output from the speaker based on the power ratio; and
estimating a second sound pressure at the target position based on a first sound pressure measured by the microphone of the measurement sound and the attenuation rate.

18. The volume adjustment method according to claim 17, further comprising:
adjusting the volume such that the second sound pressure is at a predetermined level.

* * * * *